US009819359B1

(12) United States Patent
Havlik et al.

(10) Patent No.: US 9,819,359 B1
(45) Date of Patent: Nov. 14, 2017

(54) MULTI-SYMBOL, MULTI-FORMAT, PARALLEL SYMBOL DECODER FOR HARDWARE DECOMPRESSION ENGINES

(71) Applicant: Microsoft Technology Licensing, LLC, Redmond, WA (US)

(72) Inventors: Robert W. Havlik, Fort Collins, CO (US); Michael J. Erickson, Fort Collins, CO (US); Amar Vattakandy, Longmont, CO (US); Derek E. Gladding, Pacifica, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/588,626

(22) Filed: May 6, 2017

Related U.S. Application Data

(60) Provisional application No. 62/432,631, filed on Dec. 11, 2016.

(51) Int. Cl.
  *H03M 7/40* (2006.01)
  *H03M 7/42* (2006.01)
  *H03M 7/30* (2006.01)

(52) U.S. Cl.
  CPC .............. *H03M 7/42* (2013.01); *H03M 7/30* (2013.01); *H03M 7/40* (2013.01); *H03M 7/4006* (2013.01)

(58) Field of Classification Search
  CPC ......... H03M 7/40; H03M 7/30; H03M 7/4006
  USPC ............................... 341/67, 107, 106, 51, 50
  See application file for complete search history.

(56) References Cited

U.S. PATENT DOCUMENTS

| 5,798,719 | A | 8/1998 | Wise et al. |
| 6,043,765 | A | 3/2000 | Twardowski |
| 6,370,671 | B1 | 4/2002 | Pan et al. |
| 6,950,930 | B2 | 9/2005 | Wise et al. |
| 8,599,841 | B1 | 12/2013 | Sriram |
| 8,907,823 | B2 * | 12/2014 | Marpe ................ H03M 7/4006 341/107 |
| 2003/0210163 | A1 | 11/2003 | Yang |
| 2004/0070525 | A1 | 4/2004 | Vassiliadis et al. |

(Continued)

OTHER PUBLICATIONS

Nikara, et al., "FPGA-Based Variable Length Decoders", In Proceedings of 22nd IFIP/IEEE International Conference on Very Large Scale Integration, Oct. 6, 2014, pp. 437-441.

(Continued)

*Primary Examiner* — Joseph Lauture

(57) ABSTRACT

In some data compression algorithms and/or standards, the compressed data comprises variable length symbols. A set of parallel decoders speculatively decode/decompress a window (i.e., sub-block) of data. Each of the decoders attempts to decode/decompress a symbol that starts at a different location in the compressed data block. Once the decoders have finished decoding a symbol (or determined that a valid symbol does not begin at the beginning of the window assigned to that decoder), a symbol strider selects the decoder outputs corresponding to valid symbols. The symbol strider successively selects decoder outputs based on the size of the previous symbols that were found to be valid. When the next valid symbol begins outside the current window, its location is stored to indicate the location of the next valid symbol in a subsequent window.

20 Claims, 11 Drawing Sheets

(56) References Cited

U.S. PATENT DOCUMENTS

2013/0148745 A1    6/2013  Agarwal et al.

OTHER PUBLICATIONS

Rudberg, et al., "High Speed Pipelined Parallel Huffman Decoding", In Proceedings of IEEE International Symposium on Circuits and Systems, Jun. 12, 1997, 4 pages.

Habib, et al., "FPGA-Based MPEG2 Decoder", In Proceedings of 14th International Conference on Microelectronics, Dec. 13, 2002, pp. 194-197.

* cited by examiner

```
┌─────────────────────────────────────────────────────────────┐
│ PROVIDE A PLURALITY OF SYMBOL DECODERS WITH A FIRST SUB-BLOCK│
│ OF DATA FROM A BLOCK OF COMPRESSED DATA WHERE EACH SYMBOL    │
│ DECODER IS PROVIDED WITH A DISTINCT WINDOW OF CONTIGUOUS DATA│
│                            1002                              │
└─────────────────────────────────────────────────────────────┘
                              │
┌─────────────────────────────────────────────────────────────┐
│    PROVIDE A FIRST SYMBOL DECODER WITH A FIRST WINDOW OF     │
│  CONTIGUOUS DATA WHERE A BEGINNING OF THE FIRST WINDOW       │
│     CORRESPONDS TO THE BEGINNING OF A FIRST VARIABLE         │
│                  LENGTH VALID SYMBOL                         │
│                          1004                                │
└─────────────────────────────────────────────────────────────┘
                              │
┌─────────────────────────────────────────────────────────────┐
│     PROVIDE A SECOND SYMBOL DECODER WITH A SECOND            │
│   WINDOW OF CONTIGUOUS DATA WHERE A BEGINNING OF THE         │
│    SECOND WINDOW CORRESPONDS TO THE BEGINNING OF A           │
│          SECOND VARIABLE LENGTH VALID SYMBOL                 │
│                          1006                                │
└─────────────────────────────────────────────────────────────┘
                              │
┌─────────────────────────────────────────────────────────────┐
│  DECODE, IN PARALLEL, BY EACH OF THE PLURALITY OF SYMBOL     │
│      DECODERS, A RESPECTIVE VARIABLE LENGTH SYMBOL           │
│                          1008                                │
└─────────────────────────────────────────────────────────────┘
                              │
┌─────────────────────────────────────────────────────────────┐
│    DETERMINE, IN PARALLEL, THE BIT LENGTH OF THE FIRST       │
│  VARIABLE LENGTH VALID SYMBOL AND THE BIT LENGTH OF THE      │
│           SECOND VARIABLE LENGTH VALID SYMBOL                │
│                          1010                                │
└─────────────────────────────────────────────────────────────┘
                              │
┌─────────────────────────────────────────────────────────────┐
│   BASED ON THE BIT LENGTH OF THE FIRST VARIABLE LENGTH       │
│   VALID SYMBOL, DETERMINE THE SECOND VARIABLE LENGTH         │
│     SYMBOL THAT WAS DECODED BY THE SECOND SYMBOL             │
│                DECODER IS A VALID SYMBOL                     │
│                           012                                │
└─────────────────────────────────────────────────────────────┘
                              │
┌─────────────────────────────────────────────────────────────┐
│   BASED ON THE BIT LENGTH OF THE FIRST VARIABLE LENGTH       │
│   VALID SYMBOL AND THE BIT LENGTH OF THE SECOND VARIABLE     │
│    LENGTH VALID SYMBOL, SELECT A THIRD SYMBOL DECODER        │
│   THAT IS TO BE PROVIDED WITH A THIRD WINDOW OF DATA FROM    │
│       A SECOND SUB-BLOCK OF DATA FROM THE BLOCK OF           │
│    COMPRESSED DATA WHERE THE BEGINNING OF THE THIRD          │
│     WINDOW CORRESPONDS TO A THIRD VARIABLE LENGTH VALID      │
│                         SYMBOL                               │
│                          1014                                │
└─────────────────────────────────────────────────────────────┘
```

FIGURE 10

MULTI-SYMBOL, MULTI-FORMAT, PARALLEL SYMBOL DECODER FOR HARDWARE DECOMPRESSION ENGINES

RELATED APPLICATIONS

This application claims the benefit of U.S. Application Ser. No. 62/432,631, filed Dec. 11, 2016, the contents of which are incorporated herein by reference in its entirety for all purposes.

BACKGROUND

In many data compression algorithms and/or standards, the data is encoded into variable length symbols. These symbols can be a mix of Huffman encoded symbols and variable length raw fields. Both the Huffman encoded symbols and the raw fields can be variable length. In addition, the Huffman encoded symbols may come from more than one Huffman tree structure. The variable length of these symbols can make parallel decoding operations difficult to perform efficiently.

SUMMARY

Examples discussed herein relate to a data decompressor that includes a compressed data supplier that provides a first set of distinct windows of contiguous data from a block of compressed data to each of a plurality of symbol decoders. The plurality of symbol decoders each attempt, concurrently, to fully decode a respective variable length symbol that begins at a respective starting location of the window of contiguous provided to that symbol decoder. The plurality of symbol decoders include a first symbol decoder that is receives a first window of data from the first set of distinct windows. This first window has a beginning that corresponds to the beginning of a first variable length valid symbol. The first symbol decoder fully decodes the first variable length valid symbol and also determines a first length of the first variable length valid symbol. The plurality of symbol decoders also includes a second symbol decoder that receives a second window of data. This second window has a beginning that corresponds to the beginning of a second variable length valid symbol. The output of the second symbol decoder is selected as an output of the data decompressor based on the first length.

In another example, an integrated circuit to decompress data includes a first symbol decoder of a plurality of symbol decoders that are operated concurrently with each other. The first symbol decoder to receives, from a data supplier, a first window of data from a block of compressed data. The first window of data corresponds to the beginning of a first valid symbol. The first symbol decoder to fully decodes the first valid symbol and also determines a length of the first valid symbol. A second symbol decoder of the plurality of symbol decoders receives, from the data supplier, a second window of data from the block of compressed data. The second window of data corresponds to the beginning of a second valid symbol. The second symbol decoder fully decodes the second valid symbol and also determines a length of the second valid symbol. A third symbol decoder of the plurality of symbol decoders receives, from the data supplier, a third window of data from the block of compressed data. The third window of data corresponds to the beginning of an apparently valid symbol. The third symbol decoder fully decodes the apparently valid symbol and also determines a length of the apparently valid symbol. The third window of data is located between the first window of data and the second window of data in the block of compressed data. A symbol selector, based on the length of the first symbol, selects the second symbol as a valid symbol.

In another example, a method of decompressing data includes providing a plurality of symbol decoders with a first sub-block of data from a block of compressed data. Each symbol decoder is provided with a distinct window of contiguous data from the first sub-block of data. The plurality of symbol decoders include a first symbol decoder that receives a first window of contiguous data. The beginning of the first window corresponds to the beginning of a first variable length valid symbol. The plurality of symbol decoders also include a second symbol decoder that receives a second window of contiguous data. The beginning of the second window corresponding to the beginning of the second variable length valid symbol in the sub-block of data. Each of the plurality of symbol decoders decodes, in parallel and from the respective window of data that was provided to that symbol decoder, a respective variable length symbol and also determines the bit length of the variable length symbol that was decoded. The first symbol decoder decoding the first variable length valid symbol. The second symbol decoder decoding the second variable length valid symbol. Based on the bit length of the first variable length valid symbol from the first symbol decoder, it is determined that the variable length symbol decoded by the second symbol decoder is a valid symbol. Based on the bit length of the first variable length valid symbol and the bit length of the second variable length valid symbol, a third symbol decoder is selected that is to be provided with a third window of data from a second sub-block of data from the block of compressed data. The beginning of the third window of data corresponding to the beginning of a third variable length valid symbol.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

FIG. 10 is a flowchart illustrating a method of decompressing data.

DETAILED DESCRIPTION OF THE EMBODIMENTS

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

In some data compression algorithms and/or standards, the compressed data comprises variable length symbols. In other words, the starting location of the next symbol in a compressed data stream is unknown until the current symbol is fully decoded. This can make it difficult to efficiently parallelize the operations required to decompress data. In an embodiment, a set of parallel decoders speculatively decode/ decompress a window (i.e., sub-block) of data. Each of the decoders attempts to decode/decompress a symbol that starts at a different location in the compressed data block. Once the decoders have finished decoding a symbol (or determined that a valid symbol does not begin at the beginning of the window assigned to that decoder), a symbol strider selects the decoder outputs corresponding to valid symbols. The symbol strider successively selects decoder outputs based on the size of the previous symbols that were found to be valid. When the next valid symbol begins outside the current window, its location is stored to indicate the location of the next valid symbol in a subsequent window.

Figure 1:
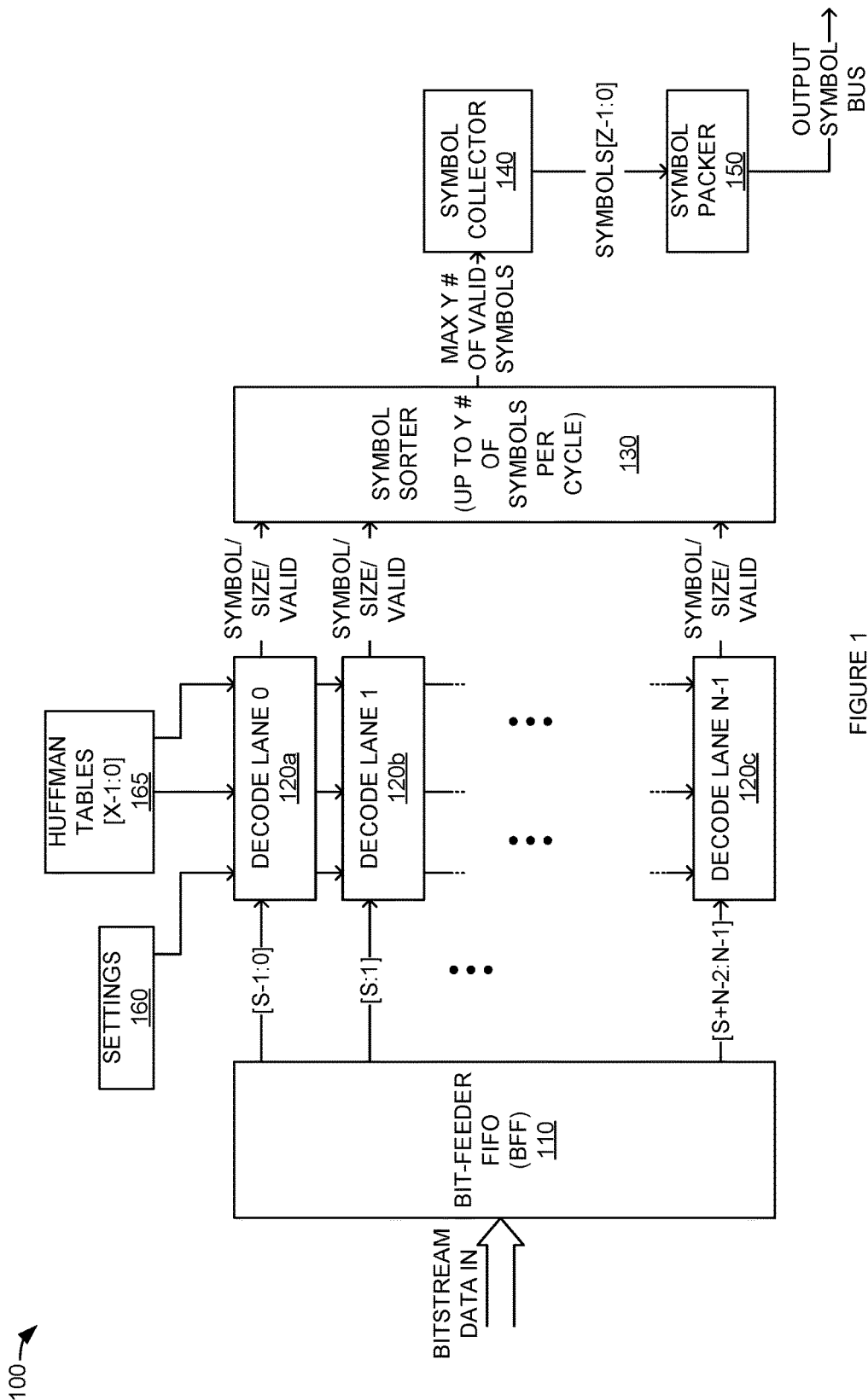
FIG. 1 is a block diagram illustrating a compressed data decoder integrated circuit.

FIG. 1 is a block diagram illustrating a compressed data decoder integrated circuit. In FIG. 1, decoder integrated circuit 100 comprises a bit-feeder first-in first-out (BFF) 110, decode lanes 120a-120c, symbol sorter 130, symbol collector 140, symbol packer 150, settings 160, and Huffman tables 165. Bit-feeder 110 provides windows of compressed data from the incoming compressed bitstream to decode lanes 120a-120c. Bit-feeder 110 provides a fixed number of bits (S number of bits in FIG. 1) to each of the N number of decode lanes 120a-120c. Typically, S is greater than N. The number of bits (S) provided to each of the decode lanes 120a-120c may be selected such that, for a particular compression scheme, S is equal to or exceeds the number of bits used in the longest encoded symbol used by that compression algorithm.

Decode lanes 120a-120c are each coupled to a different starting position in the input bitstream. These starting positions correspond to every possible starting position of a codeword for a fixed number of bits output by BFF 110. This fixed number of bits corresponds to the number of decode lanes, N. In other words, decode lane 0 120a receives bits 0 to S−1 from BFF 110; decode lane 1 120b receives bits 1 to S, decode lane 3 receives bits 2 to S+1, and so on with decode lane N−1 receiving bits N−1 to S+N−2. Each of decode lanes 120a-120c starts at a different bit position on the input data stream. Thus, each of decode lanes 120a-120c receives a unique (but overlapping) S number of bits (a.k.a., sub-block) from BFF 110. Decode lanes 120a-120c each fully decode a codeword that starts at the beginning of the bits received by that respective decode lane 120a-120c.

In other words, integrated circuit 100 uses decode lanes 120a-120c to perform N number of decodes in parallel or concurrently that cover every possible starting bit position for a codeword and also determines which of the decodes appears to be valid (i.e., received a sub-block of data with a starting bit position that, when decoded, results in a valid decoding.) Thus, multiple decode lanes may decode multiple codewords in an iteration.

The output of the decode lanes may include a length (or size) field and a valid indicator. The size field indicates the size of the codeword that was decoded. The valid indicator corresponds to whether a valid code has been decoded. In other words, the valid indicator indicates whether the output (decoded codeword and corresponding size) of that decode lane 120a-120c is not (yet) known to be invalid. The decoded symbol, symbol length field, and valid indicator are provided by each respective decode lane 120-120c to a symbol sorter 130.

Decode lanes 120a-120c receive configuration information from settings 160. For example, settings 160 may determine the compression scheme (e.g., GZIP, DEFLATE, XPRESS9, etc.) being decoded. Decode lanes 120a-120c also receive Huffman table information (e.g., a representation of one or more Huffman code trees) that allows decode lanes 120a-120c to decode according to the selected compression scheme.

Symbol sorter 130 receives a decoded symbol, a symbol size, and a valid indicator from each of decode lanes 120a-120c. Symbol sorter 130 selects the valid decoded symbols from the set of decoded symbols provided by decode lanes 120a-120c. Symbol sorter 130 selects the decoded symbols that are valid using the symbol sizes from the preceding symbols that have been determined to be valid. These symbol sizes determine the locations of the (next) valid symbol. In other words, the preceding symbol sizes determine where in the bitstream the next valid symbol starts. Thus, the preceding symbol sizes determine which decode lane 120a-120c decoded the next valid symbol. Any intervening decode lanes 120-120c that did not resolve to a valid symbol by virtue of its location can be ignored, even if the decoded symbol appeared to be valid.

Symbol sorter 130 may be configured to find and output multiple (e.g., up to Y number) of decode lane 120a-120c identifiers that decoded valid symbols per cycle. The up to Y number of decode lane 120a-120c identifiers are provided to symbol collector 140. Symbol collector 140 uses these decode lane 120a-120c identifiers to select (e.g., using a multiplexer) the symbols to be provided to symbol packer 150. Symbol packer 150 consolidates the now-known valid symbols for efficient transmission to a downstream functional unit. In other words, a downstream functional unit will generally be designed to accept a fixed number of symbols per iteration, while the symbol sorter may resolve a variable number of valid symbols on each iteration. The symbol packer 150 collects a variable number of valid symbols and re-packs them into a fixed output bus. For example, the symbol sorter may resolve 0-7 symbols per iteration and a downstream unit is designed to accept 4 symbols per iteration. In this example, if the sorter finds 7 valid symbols in one iteration, and 1 valid symbol the next iteration, the packer produces 2 iterations with 4 symbols each.

Figure 2:
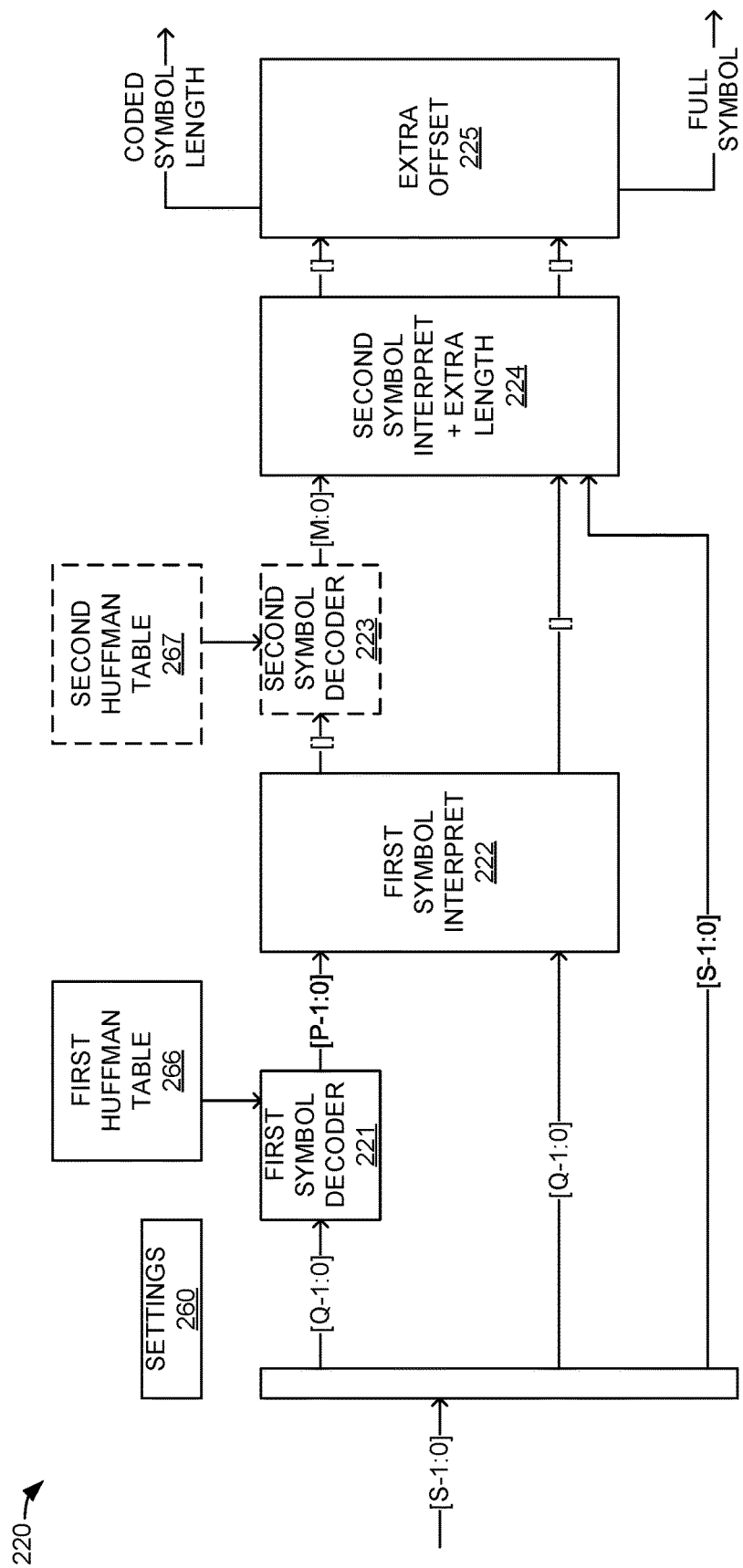
FIG. 2 is a block diagram illustrating a decoder lane.

FIG. 2 is a block diagram illustrating a decoder lane. In FIG. 2, decoder lane 220 comprises first symbol decoder 221, first symbol interpreter 222, second symbol decoder 223, second symbol interpreter 224, and extra offset 225. Settings 260 determine various aspects of the operation of decoder lane 220. Settings 260 determine aspects such as the type of encoding being decoded, the number of bits that are processed by symbol decoders 221 and 223, and so on. First symbol decoder 221 is provided with and/or stores a first Huffman table 266 that is used to decode symbols. Optional second symbol decoder 223 may be provided with and/or store a second Huffman table 267 that is used to decode symbols not decoded by the first symbol decoder 221. Thus, symbols created by compression schemes that use more than one Huffman tree can be decoded by decoder lane(s) 220. It should be understood that additional decoders (e.g., third, fourth, etc.) may be included in order to decode compression schemes that use more than two Huffman trees.

In FIG. 2, first symbol decoder receives Q number of bits. In an embodiment, Q is selected to be the maximum number of bits required to decode a symbol in the first Huffman table 266. After decoding, first symbol decoder 221 provides first symbol interpret 222 with P number of bits. First symbol interpret 222 also receives the Q number of bits provided to first symbol decoder 221. First symbol interpret 222 provides second symbol decoder 223 with any decoded first symbols (e.g., literals and/or pointers) and/or an indicator that more bits are necessary to decode the current symbol. Thus, first symbol decoder 221 and first symbol interpret 222 function as a first level table that covers Q number of bits of input. If the current symbol is Q bits or less, first symbol interpret 222 will indicate the decoded symbol value. Otherwise, first symbol interpret 222 will indicate to second symbol decoder 223 and second symbol interpret 224 to try to decode a longer code.

Second symbol decoder 223, second symbol interpret 224, and extra offset 225 decode and/or use additional bits from the input stream to decode the remainder of the symbol. The output from extra offset 225 is a fully decoded symbol and the symbol length of the coded symbol input to decoder lane 220 that resulted in the fully decoded symbol.

Figure 3:
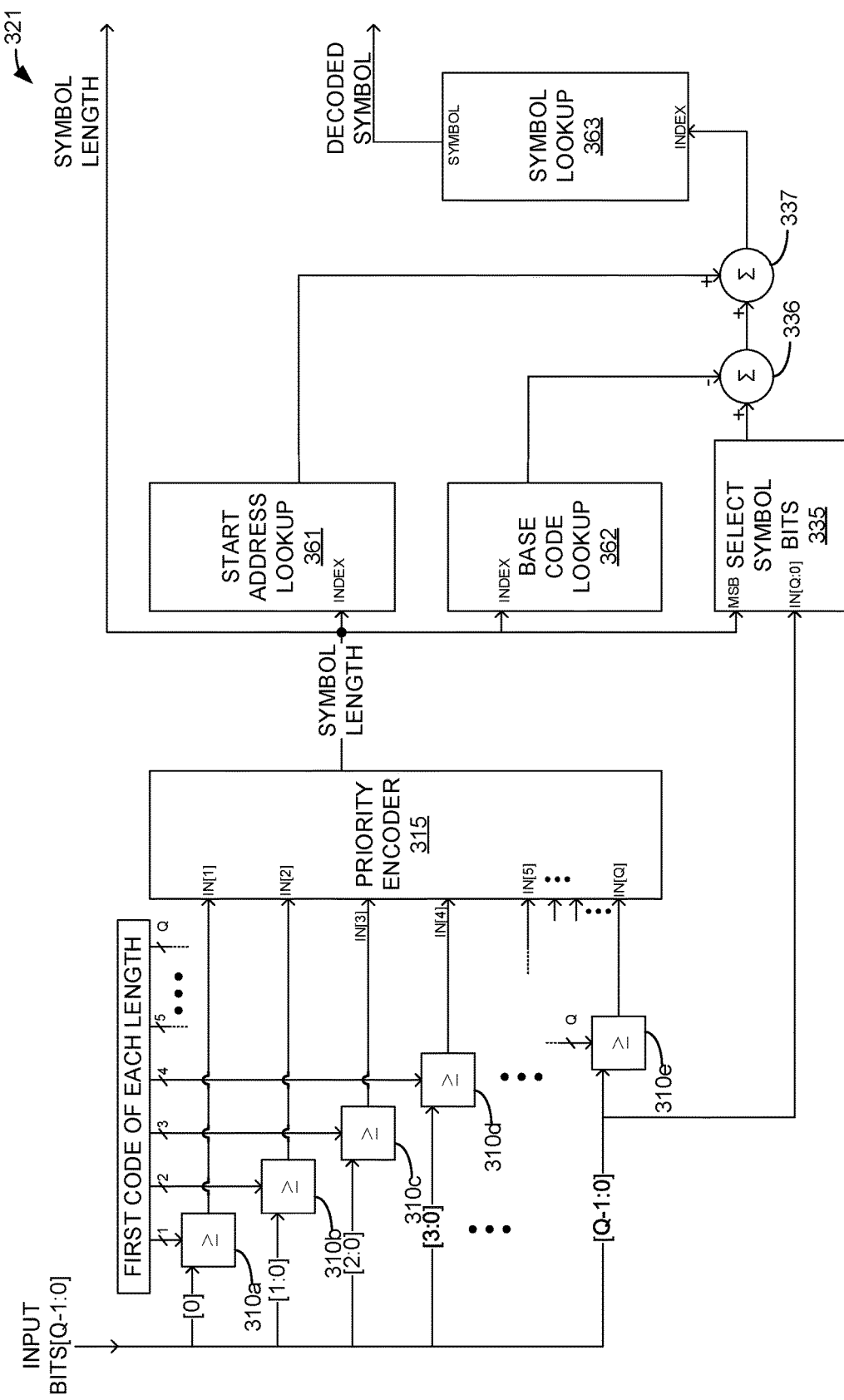
FIG. 3 is a block diagram illustrating a variable length symbol decoder.

FIG. 3 is a block diagram illustrating a variable length symbol decoder. In FIG. 3, symbol decoder 321 comprises comparators 310a-310e, priority encoder 315, start address lookup 361, base code lookup 362, symbol bit selection 335, adder 336, adder 337, and symbol lookup 363. Symbol decoder 321 may be an example of first symbol decoder 221 and/or second symbol decoder 223. Symbol decoder 321 may be sized to decode symbols from any Canonical Huffman code tree. The resulting decoded symbols may then be mapped to symbols in a given compression standard. Base code lookup 362 relates each encoded bitlength to the first (e.g., lowest numerical value) encoded symbol having that respective bitlength. Start address lookup 361 is a table comprised of storage elements that relates the symbols of a given size (e.g., bit lengths) to the starting location in symbol lookup 363 of encoded symbols that have that size. In other words, start address lookup 361 associates the respective bitlengths of the encoded symbol values to the first location in symbol lookup 363 having an encoded symbol with that respective bitlength. Symbol lookup 363 is a table comprised of storage elements that relate an index value to a respective decoded symbol.

Comparators 310a-310e are each provided with a unique number of input bits. In other words, comparator 310a is provided with the least significant input bit; comparator 310b is provided with the two least significant input bits; comparator 310c is provided with the three least significant bits, comparator 310d is provided with the four least significant bits, and so on with comparator 310e being provided with Q number of inputs bits.

Each of comparators 310a-310e compares the input bits it is provided with to the first coded symbol of corresponding length. In other words, comparators 310a compares the least significant input bit to the coded symbol (if any) having one bit; comparator 310b compares the two least significant input bits to the first (i.e., lowest valued) coded symbol (if any) having two bits; comparator 310c compares the three least significant bits to the first (i.e., lowest valued) coded symbol (if any) having three bits, and so on with comparator 310e comparing the Q number of inputs bits to the first (i.e., lowest valued) coded symbol (if any) having Q number of bits. The outputs of comparators 310a-310e are provided to priority encoder 315.

Priority encoder 315 uses the outputs of comparators 310a-310e to determine the length of the coded symbol in the input bitstream. Priority encoder 315 finds the length of the coded symbol by examining the outputs of comparators 310a-310e for the smallest (i.e., shortest in length and lowest Huffman tree level) coded symbol that is less than the corresponding input bits. In other words, if the input bitstream starts with a 3-bit coded symbol, comparators 310a and 310b would indicate the input bitstream is greater than the first (i.e., lowest valued) coded symbol (if any) having one bit and two bits, respectively. Comparator 310c, however, would indicate the input bitstream is greater than the first (i.e., lowest valued) coded symbol (if any) having three bits—thereby indicating the first coded symbol has three bits. The symbol length found by priority encoded 315 may be output by symbol decoder 321.

The symbol length found by priority encoded 315 is also provided to start address lookup 361, base code lookup 362, and select symbol bits 335. Start address lookup 361 receives the symbol length found by priority encoder 315. Start address lookup 361 is a table indexed by symbol length that provides a base pointer into a symbol lookup 363. Base code lookup 362 is also indexed by symbol length. Base code lookup 362 provides the first (i.e., lowest valued) coded symbol of the corresponding coded length. Select symbol bits 335 outputs the corresponding bits from the input stream that correspond to the coded symbol of the corresponding length. For example, if priority encoder 315 found that input stream began with a 3-bit coded symbol, select symbol bits 335 would output the first three bits (i.e., the coded symbol) from the input stream.

The coded symbol from the input stream that is output by select symbol bits 335 is provided to adder 336. The base code of corresponding length output by base code lookup 362, is subtracted from the coded symbol from the input stream. This provides an indicator of which coded symbol of the indicated length corresponds to the coded symbol from the input stream. The output of adder 336 is provided to adder 337. Adder 337 receives, from start address lookup 361, a value corresponding to a location in symbol lookup table 363 where decoded symbols corresponding to the coded symbol length begin. The output of adder 337 is provided as an index to symbol lookup 363. The output of symbol lookup 363 is a fully decoded symbol.

Figure 4:
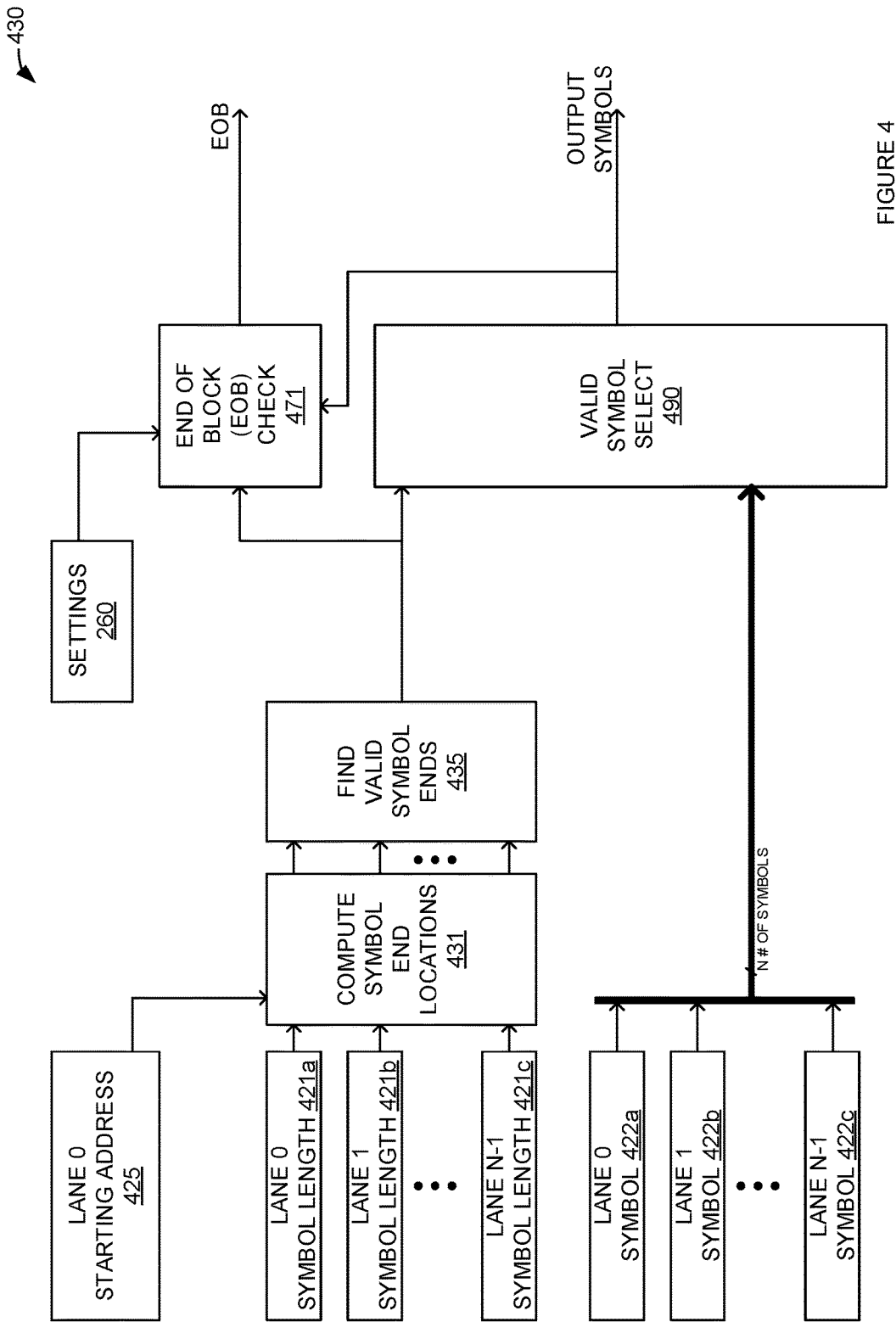
FIG. 4 is a block diagram illustrating a symbol sorter.

FIG. 4 is a block diagram illustrating a symbol sorter. In FIG. 4, symbol sorter 430 comprises symbol end computation 431, valid symbol end selector 435, valid symbol selection 490, settings 260, and end of block check 471. Symbol end computation 431 receives, from each decoder lane (e.g., decoder lanes 120a-120c), the lengths 421a-421c of the symbols found by each respective decoder lane. Symbol end computation 431 also receives the address (i.e., location) in the input bitstream of the least significant bit provided to the first (e.g., decode lane 120a) decoder lane. In other words, lane 0 starting address 425, which corresponds to the location of bit S[0] in FIG. 1, is provided to symbol end computation 431. Symbol end computation 431 outputs, to valid symbol end selector 435 the end location of each candidate symbol. The end location of each of the candidate symbols may be expressed as a relative (i.e., decode lane number) and/or absolute address (i.e., a location of expressed as a position/location in the complete block of data being decoded.)

Valid symbol end selector 435 determines, from the end location of each of the coded symbols, which end locations correspond to the end of valid symbols. It should be noted that the end locations of the valid symbols also therefore indicate that the next bit in the bitstream is the beginning of the next valid symbol. Valid symbol end selector 435 iteratively outputs the locations of the valid symbols that it has determined.

For example, if decoder lane 0 indicates it found a symbol having a length of two bits, decoder lane 1 indicated it had found a symbol of length four bits, decoder lane 2 indicates it found symbol of length eight bits, and decoder lane three indicates it found a symbol of length three bits, valid symbol end selector 435 would first output an indicator that decode lane 2 (lane 0 location plus the size of the first valid symbol—which was 2-bits) decoded the next valid symbol. Valid symbol end selector 435 would then output an indicator that decode lane 2 decoded the next valid symbol was decoded by lane 10 (lane 2 location plus the size of the second valid symbol which was 8 bits), and so on. Note that in this example, the output of lane 1 is ignored.

Valid symbol end selector 435 repeats outputting the location of the next valid symbol until a location that is outside of the sub-block of data being currently decoded by the decode lanes is found. When that occurs, a new set of input bits are provided to the decode lanes 120a-120c, a new lane 0 starting address 425 is calculated, and the decode lane 120a-120c that will produce the next valid symbol is determined.

The locations of the valid symbols that valid symbol end selector 435 iteratively outputs are also supplied to valid symbol selector 490 and end of block (EOB) check 471. End of block check 471 can determine when the end of a block of compressed data has been fully decoded. End of block check 471 is configured to determine when the end of a block of compressed data has been fully decoded by settings 260. For example, end of block check 471 may be configured to determine when either based on the output from valid symbol selection 490 (e.g., an end of block symbol is output) or when a valid symbol end location matches a known end location for a block.

Valid symbol selector 490 receives the symbols 422a-422c that were found by decode lanes 120a-120c. Note that these symbols 422a-422c have sizes that respectively correspond to symbol lengths 421a-421c. Using the end/start locations that valid symbol end selector 435 iteratively outputs, valid symbol selector 490 outputs the valid symbols that have been output by decode lanes 120a-120c and ignores the invalid symbols that were output by decode lanes 120a-120c.

Figure 5:
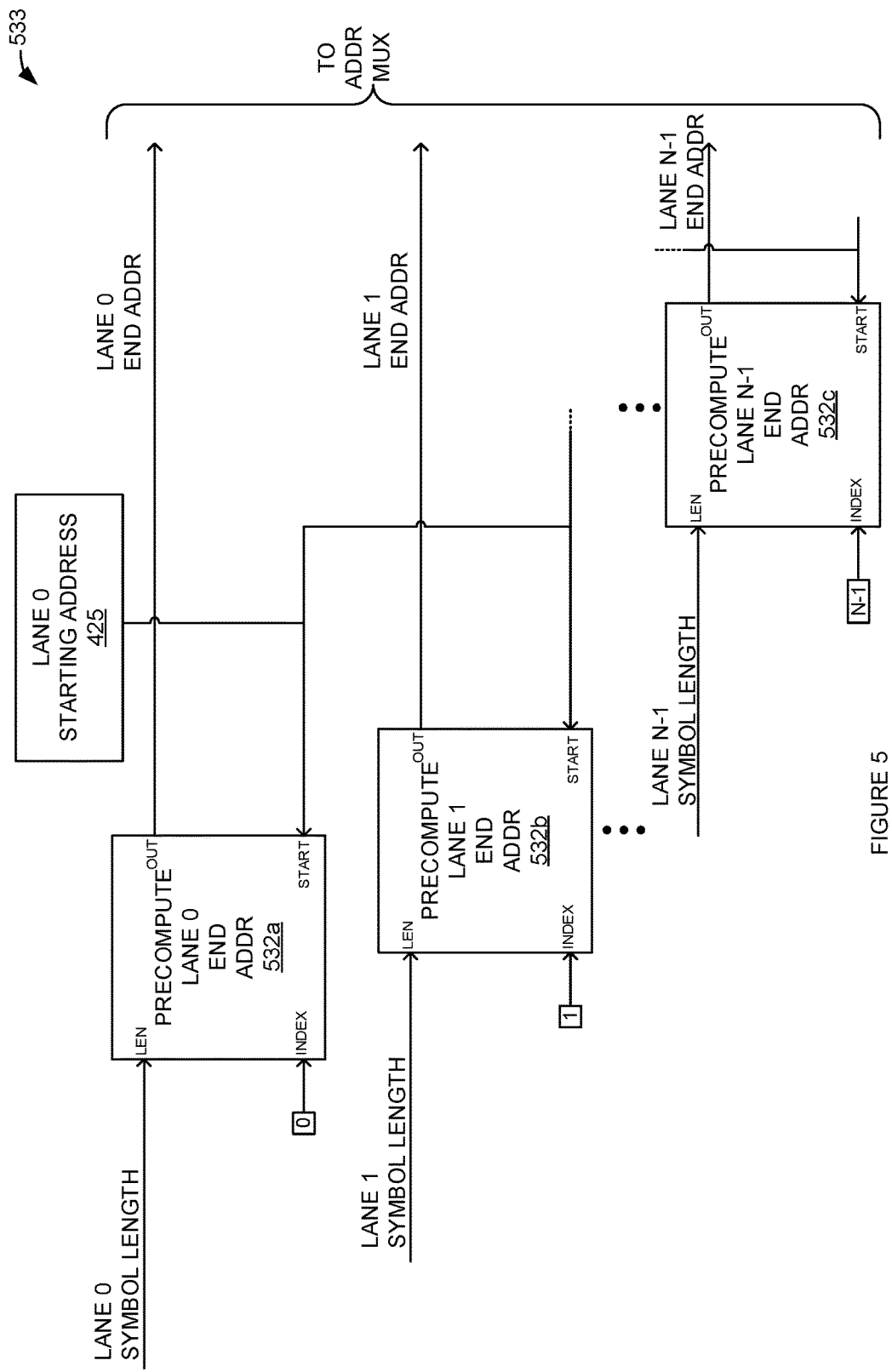
FIG. 5 is a block diagram illustrating a precompute block for absolute end addresses.

FIG. 5 is a block diagram illustrating a precompute block for absolute end addresses. Absolute end precompute 533 may be part of symbol end computation 431. Precompute 533 comprises end address computation blocks 532a-532c. For each decode lane (120a-120c), the symbol length found by that decode lane is added by a respective end address computation block 532a-532c to the lane 0 starting address 425 and an index value that corresponds to that decode lane to produce the end address, expressed as a position/location in the complete block of data being decoded, of the symbol found by that decode lane. The index value represents the number of bits the starting bit location of a respective lane is offset from the starting address of lane 0. In other words, the index value is zero (0) for decode lane 0, 1 for decode lane 1, and so on. Thus, precompute 533 speculatively computes the end addresses of the symbols found by decode lanes 120a-120c regardless of whether a respective decode lane 120a-120c has found a valid symbol.

Figure 6:
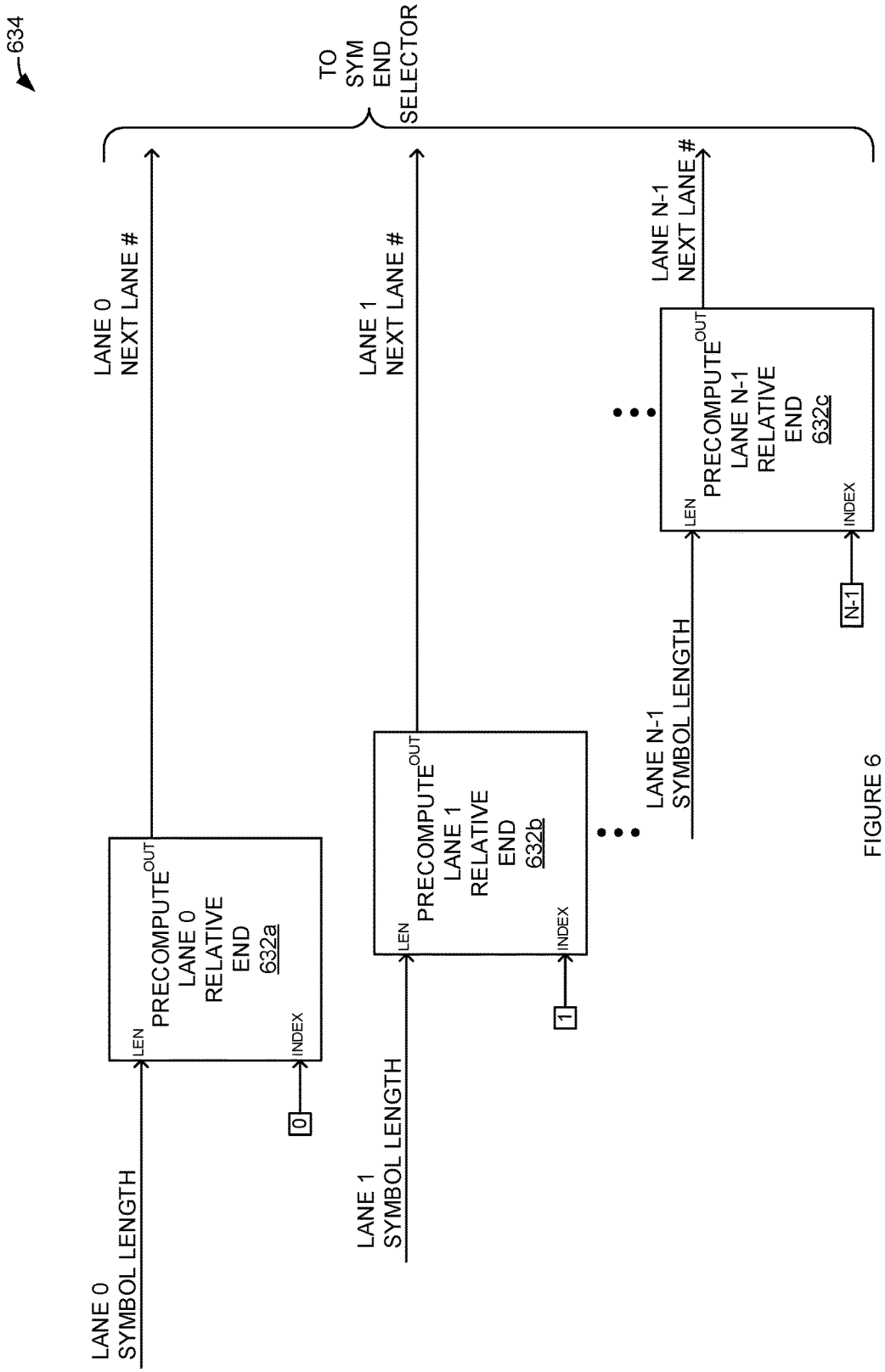
FIG. 6 is a block diagram illustrating a precompute block for relative end addresses.

FIG. 6 is a block diagram illustrating a precompute block for relative end addresses. Relative end precompute 634 may be part of symbol end computation 431. Precompute 634 comprises decode lane number computation blocks 532a-532c. For each decode lane (120a-120c), the symbol length found by that decode lane is added by a respective lane number computation block 632a-632c to an index value that corresponds to that decode lane to produce the decode lane number that has the next valid symbol. The index value represents the number of bits the starting bit location of a respective lane is offset from the starting address of lane 0. In other words, the index value is zero (0) for decode lane 0, 1 for decode lane 1, and so on. Thus, precompute 634 speculatively computes which lane would have the next valid symbol found by the decode lanes 120a-120c if the respective decode lane had a valid symbol. Precompute 634 makes these calculations regardless of whether a respective decode lane 120a-120c turns out to have found a valid symbol.

Figure 7:
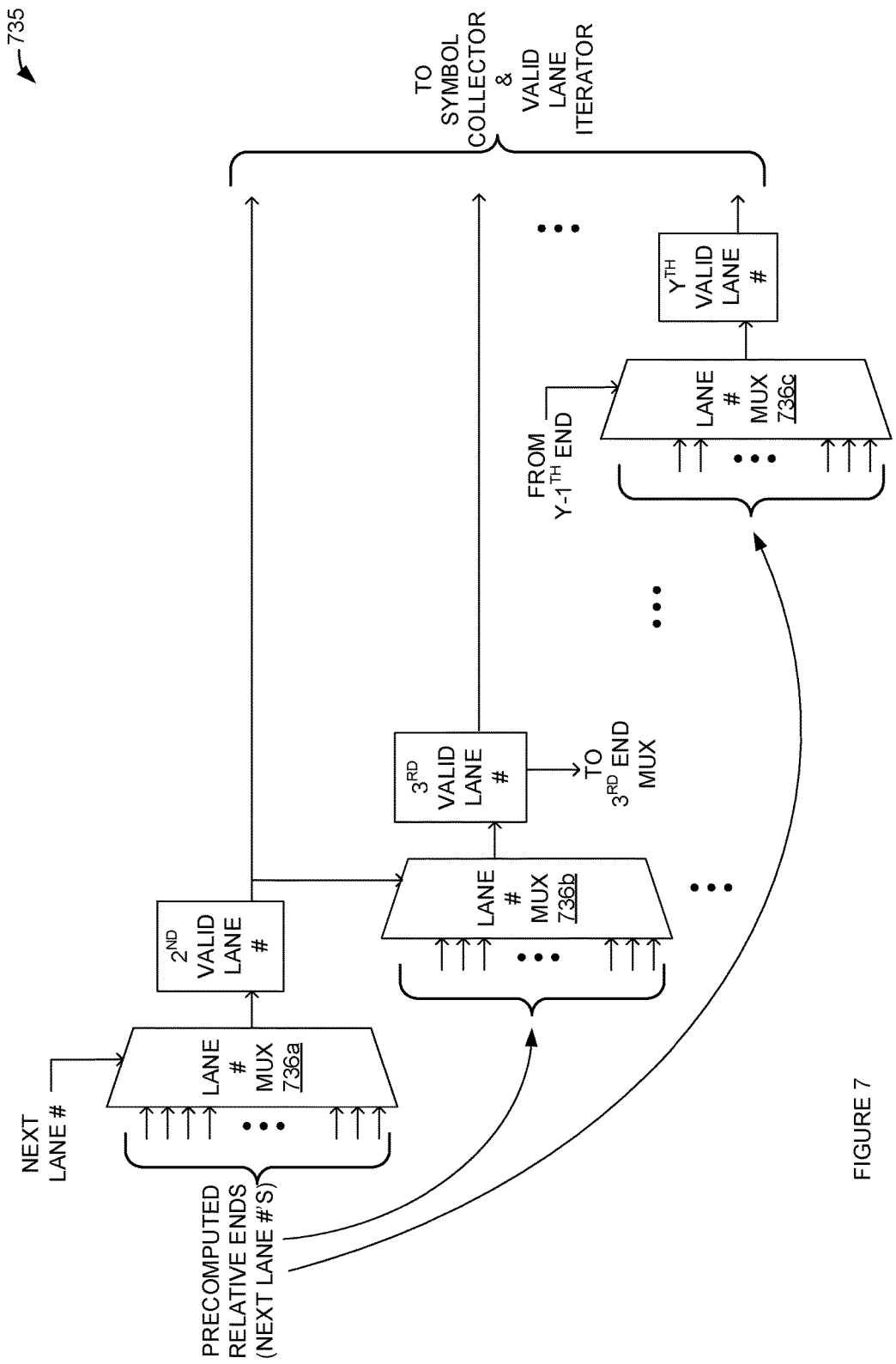
FIG. 7 is a block diagram illustrating a valid lane selector.

FIG. 7 is a block diagram illustrating a valid lane selector. Lane selector 735 may be part of valid symbol end selector 435. Lane selector 735 outputs up to Y number of lane indicators. These indicators correspond to decode lanes 120a-102c that have decoded valid symbols. Lane number multiplexers (MUXes) 736a-736c receive the precomputed lane number values from, for example, relative end precompute 634. Lane number MUX 736a receives a next lane number value and selects the corresponding precomputed lane number for output as a decode lane number that has decoded a valid symbol. On each iteration of outputting up to Y number of lane indicators, the next lane number value that MUX 736a receives is determined by the symbol length of the symbol found in the last iteration by the last decode lane 120a-120c to find a valid symbol. Thus, on each iteration, MUX 736a receives the next valid lane number through a feedback loop which resolves the location of the next valid symbol in the sub-block. It should be understood that the next valid symbol location does not always come from the Yth mux (736c). It could be from any of the MUXes 736a-736c.

For each iteration, if there is a valid symbol in the current set of data output from the decode lanes, the value output by MUX 736a corresponds to the lane number that has decoded the next valid symbol. This value is provided to MUX 736b to select the next corresponding precomputed lane number for output as a decode lane number that has decoded a valid symbol (if the next valid symbol is in the current window). This chained selection of the next valid lane number and then usage of the next valid lane number to select the subsequent valid lane number is repeated for Y number of MUXs per iteration. The valid lane numbers output by lane selector 735 (i.e., the lane numbers corresponding to decode lanes 120a-120c that have decoded valid symbols) can be provided to valid symbol selector 490. When the next valid symbol corresponds to a location that has not been decoded by a decode lane 120a-120c, the next set of lane outputs is invalid. For example, if there are 32 decode lanes 120a-

120c, and one of the decode lanes 120a-120c lanes finds an 80 bit symbol, the next set of lane outputs (next iteration) are all invalid.

Figure 8:
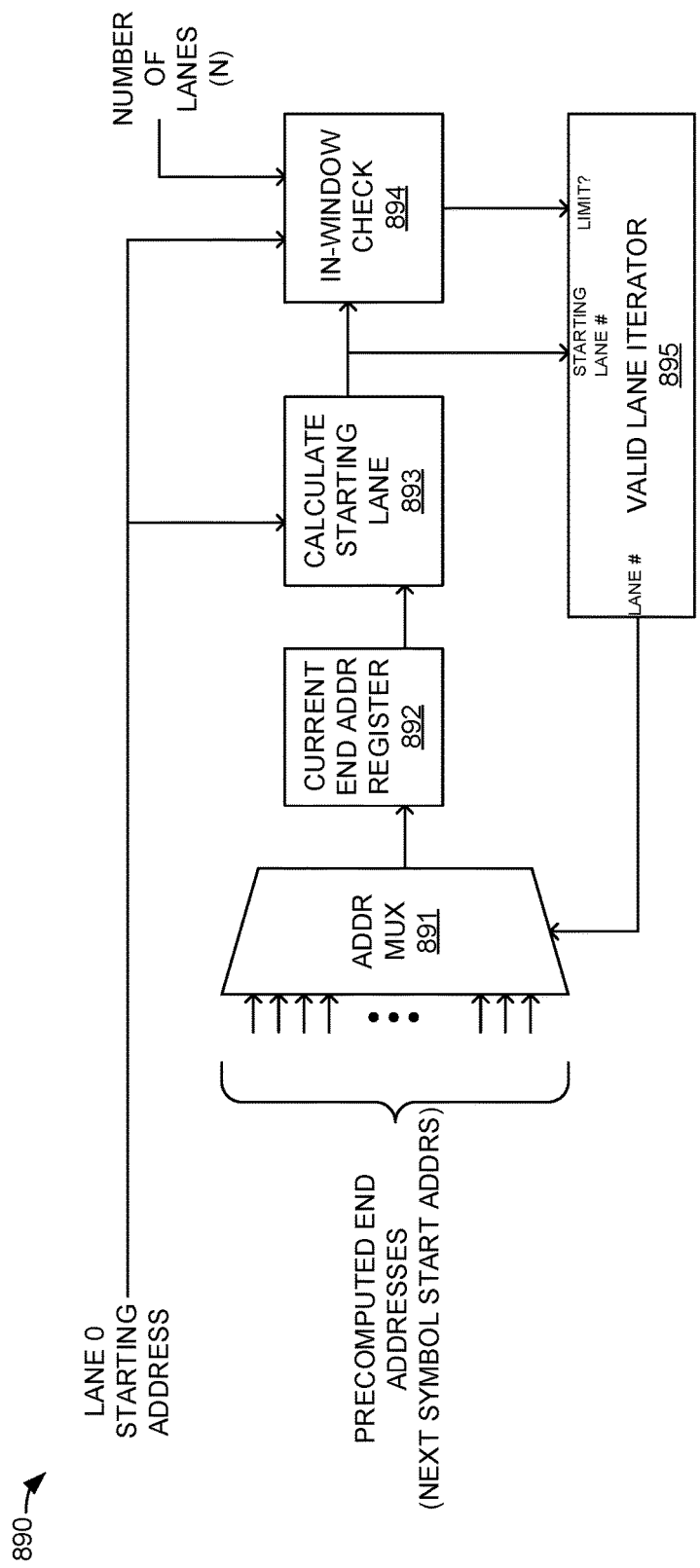
FIG. 8 is a block diagram illustrating a symbol strider.

FIG. 8 is a block diagram illustrating a symbol strider. Symbol strider 890 comprises address MUX 891, current end address register 892, starting lane calculation 893, in-window check 894, and valid lane iterator 895. Valid lane iterator 895 may include lane selector 735. Valid lane iterator 895 successively outputs (i.e., for each iteration) a lane number value corresponding to the next decode lane 120a-120c that has decoded a valid symbol (note: each iteration is not necessarily a single clock cycle.) For the first iteration, the lane number value corresponds to decode lane 0 120a. To output a lane number value corresponding to the next decode lane 120a-120c that has decoded a valid symbol, a precomputed absolute end address corresponding to the location in the decode block of the start of the next valid symbol is selected by address MUX 891 (e.g., from the outputs of absolute end precompute 533.) This location value is stored in current end address register 892, is optionally provided to BFF 110, and is provided to starting lane calculation 893.

Starting lane calculation 893 determines the lane number that corresponds to the starting lane for the next iteration by lane selector 735. Starting lane calculation 893 also provides this value to in-window check 894. In-window check 894 determines whether the next starting location in the bitstream is a location that is in the range of bits provided to decode lanes 120a-120c. If the starting location is within the range of bits processed by decode lanes 120a-120c, another iteration of selecting valid symbols from decode lanes 120a-120c can proceed. If the starting location is not within the range of bits process by decode lanes 120a-120c, another set of candidate symbols are fed in from the decoder lanes.

Figure 9:
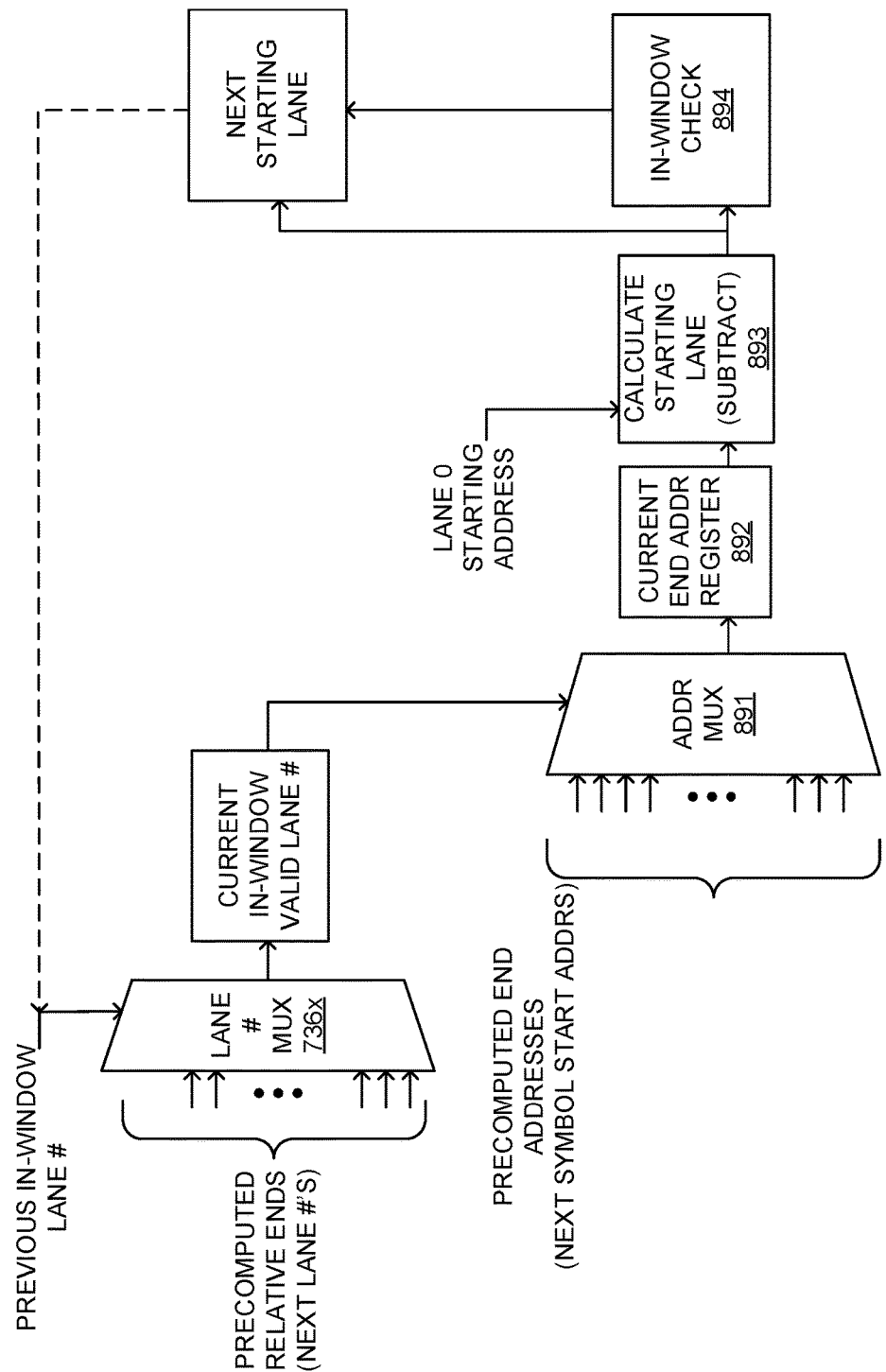
FIG. 9 is a block diagram illustrating a feedback path for symbol striding.

FIG. 9 is a block diagram illustrating a feedback path for symbol striding. A given lane number MUX 736x (which is one of lane number multiplexers MUXs 736a-736c) receives an indicator of a decode lane 120a-120c that has decoded the next valid symbol. This valid lane number is received from either a previous iteration or from starting lane calculation 893. Based on this lane number, lane number MUX 736x provides the current (in-window) lane number to address MUX 891 which then selects the corresponding precomputed location for the end of this symbol to current end address register 892. Based on this address, the next starting lane is calculated. The next starting lane is also checked to determine whether the next starting lane is within the range of bits process by decode lanes 120a-120c. If the starting location is within the range of bits process by decode lanes 120a-120c, another iteration of selecting valid symbols from decode lanes 120a-120c can proceed. If the starting location is not within the range of bits process by decode lanes 120a-120c, another set of bits needs to be supplied to, and be decoded by, decode lanes 120a-120c before another decoded symbol can be output.

Accordingly, it should be understood from FIG. 9 that before a decode symbol can be output by decoder 100, the feedback loop illustrated in FIG. 9 needs to be completed. However, in an embodiment, by precomputing the relative ends (i.e., decode lane numbers) of the symbols found by decode lanes 120a-120c, and precomputing the absolute end addresses of the symbols found by decode lanes 120a-120c, this feedback loop is reduced to relatively fast operating MUXs (i.e., MUX 736x and address MUX 891) and a small (e.g., log 2[N] number of bits adder (i.e., starting lane calculation 893.)

FIG. 10 is a flowchart illustrating a method of decompressing data. The steps illustrated in FIG. 10 may be performed, for example, by one or more elements of decoder integrated circuit 100. A plurality of symbol decoders are provided with a first sub-block of data from a block of compressed data where each symbol decoder is provided with a distinct window of contiguous data (1002). For example, decode lanes 120a-120c may be provided, by bit feeder FIFO 110, with windows of compressed data as described herein.

A first symbol decoder is provided with a first window of contiguous data where a beginning of the first window corresponds to the beginning of a first variable length valid symbol. For example, decode lane 120a may be provided with a window of data that consists of S number of bits that are known to begin with a valid coded symbol. This window of data may be known to begin with a valid coded symbol because it is at the start of the encoded data and/or is known to start with a valid symbol based on the ending location of an already decoded coded symbol.

A second symbol decoder is provided with a second window of contiguous data where a beginning of the second window corresponds to the beginning of a second variable length valid symbol (1006). For example, decode lane 120c may be provided with window of data that consists of S number of bits that are known to begin with a valid coded symbol because decode lane 120c was indicated by valid lane iterator 895 to have decoded a valid symbol.

In parallel and by each of the plurality of symbol decoders, respective variable length symbols are decoded (1008). For example, decode lanes 120a-120c may operate in parallel to each attempt to decode variable length symbols. In parallel, the bit length of the first variable length valid symbol and the bit length of the second variable length valid symbol are determined. The length of the first variable length symbol and the length of the second variable length symbol are determined in parallel (1010). For example, decode lane 120 a may determine, while decoding the first variable length symbol, the number of bits that are in the first variable length symbol. Likewise, the length of the second variable length symbol may be determined by decode lane 120c as it decodes the second variable length symbol.

Based on the bit length of the first variable length valid symbol, it is determined that the second variable length symbol that was decoded by the second symbol decoder is a valid symbol. For example, based on the length of the first variable length symbol that was decoded by decoding lane 120a, valid symbol iterator 895 may determine that decode lane 120c has decoded a valid symbol. Based on the bit length of the first variable length valid symbol and the bit length of the second variable length valid symbol, a third symbol decoder that is to be provided with a third window of data from a second sub-block of data from the block of compressed data is determined—where the beginning of the third window corresponds to a third variable length valid symbol (1014). For example, the symbol lengths of the symbols decoded by decoder lane 120a and decoder lane 120c may be used to determine at least part of the value that is stored in current end address register 892. This value may be provided to lane selector 735 such that the when a new sub-block of data is decoded by decode lanes 120a-120c the next valid symbol is selected by lane selector 735.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of decoder integrated circuit 100, and its components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 11 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Figure 11:
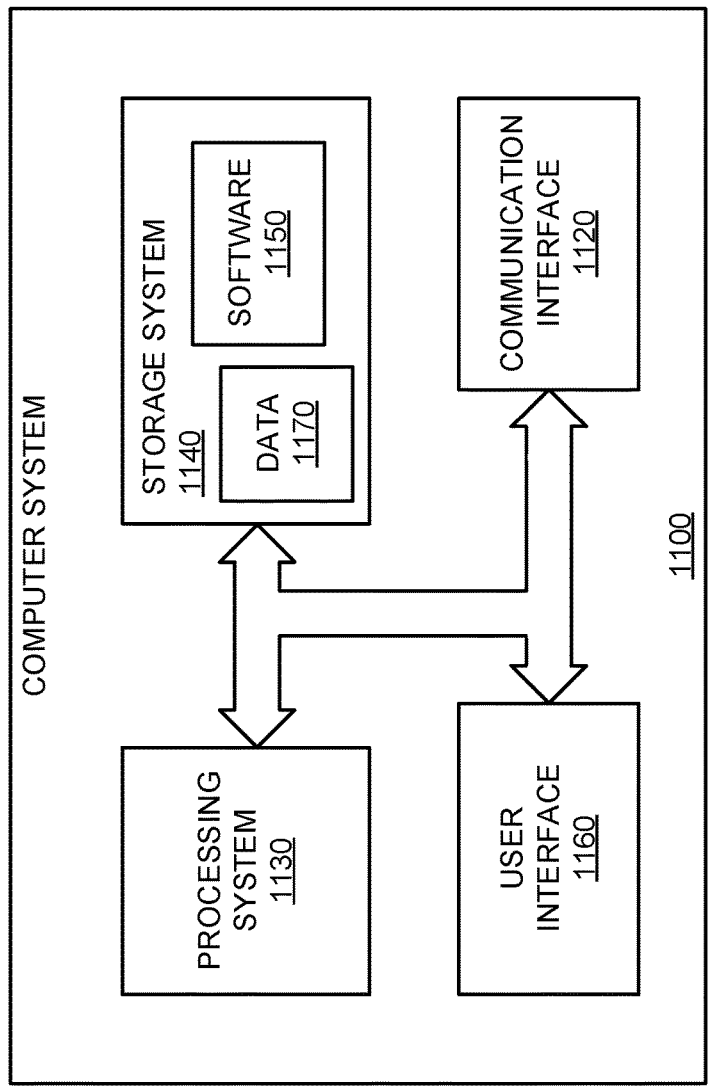
FIG. 11 is a block diagram of a computer system.

FIG. 11 is a block diagram of a computer system. In an embodiment, computer system 1100 and/or its components include circuits, software, and/or data that implement, or are used to implement, the methods, systems and/or devices illustrated in the Figures, the corresponding discussions of the Figures, and/or are otherwise taught herein.

Computer system 1100 includes communication interface 1120, processing system 1130, storage system 1140, and user interface 1160. Processing system 1130 is operatively coupled to storage system 1140. Storage system 1140 stores software 1150 and data 1170. Processing system 1130 is operatively coupled to communication interface 1120 and user interface 1160. Storage system 1140 and/or communication interface 1120 are examples of a subsystems that may include integrated circuit 100, integrated circuit 200, integrated circuit 600 and/or their components.

Computer system 1100 may comprise a programmed general-purpose computer. Computer system 1100 may include a microprocessor. Computer system 1100 may comprise programmable or special purpose circuitry. Computer system 1100 may be distributed among multiple devices, processors, storage, and/or interfaces that together comprise elements 1120-1170.

Communication interface 1120 may comprise a network interface, modem, port, bus, link, transceiver, or other communication device. Communication interface 1120 may be distributed among multiple communication devices. Processing system 1130 may comprise a microprocessor, microcontroller, logic circuit, or other processing device. Processing system 1130 may be distributed among multiple processing devices. User interface 1160 may comprise a keyboard, mouse, voice recognition interface, microphone and speakers, graphical display, touch screen, or other type of user interface device. User interface 1160 may be distributed among multiple interface devices. Storage system 1140 may comprise a disk, tape, integrated circuit, RAM, ROM, EEPROM, flash memory, network storage, server, or other memory function. Storage system 1140 may include computer readable medium. Storage system 1140 may be distributed among multiple memory devices.

Processing system 1130 retrieves and executes software 1150 from storage system 1140. Processing system 1130 may retrieve and store data 1170. Processing system 1130 may also retrieve and store data via communication interface 1120. Processing system 1150 may create or modify software 1150 or data 1170 to achieve a tangible result. Processing system may control communication interface 1120 or user interface 1160 to achieve a tangible result. Processing system 1130 may retrieve and execute remotely stored software via communication interface 1120.

Software 1150 and remotely stored software may comprise an operating system, utilities, drivers, networking software, and other software typically executed by a computer system. Software 1150 may comprise an application program, applet, firmware, or other form of machine-readable processing instructions typically executed by a computer system. When executed by processing system 1130, software 1150 or remotely stored software may direct computer system 1100 to operate as described herein.

Implementations discussed herein include, but are not limited to, the following examples:

Example 1

A data decompressor, comprising: a compressed data supplier to provide a first set of distinct windows of contiguous data from a block of compressed data to each of a plurality of symbol decoders; the plurality of symbol decoders to each attempt, concurrently, to fully decode a respective variable length symbol that begins at a respective starting location of the window of contiguous provided to the respective symbol decoder; the plurality of symbol decoders to include a first symbol decoder that is to receive a first window of data from the first set of distinct windows having a beginning that corresponds to a beginning of a first variable length valid symbol, the first symbol decoder to fully decode the first variable length valid symbol and to determine a first length of the first variable length valid symbol; and, the plurality of symbol decoders to include a second symbol decoder that is to receive a second window of data having a beginning that corresponds to a beginning of a second variable length valid symbol, the output of the second symbol decoder to be selected as an output of the data decompressor based on the first length.

Example 2

The data decompressor of example 1, wherein the second variable length valid symbol is in the first set of distinct windows.

Example 3

The data decompressor of example 1, wherein the second variable length valid symbol is in a second set of distinct windows.

Example 4

The data decompressor of example 3, wherein the second symbol decoder is to fully decode a second variable length valid symbol and is to determine a second length of the second variable length valid symbol.

Example 5

The data decompressor of example 4, wherein the second set of distinct windows is to, based on the first length, be determined to include the second variable length valid symbol.

Example 6

The data decompressor of example 1, wherein a first location in the block of compressed data where the first variable length valid symbol begins is to be calculated concurrently with a second location in the block of compressed data where the second variable length valid symbol begins.

Example 7

The data decompressor of example 1, wherein a first indicator corresponding to the first symbol decoder is to be calculated concurrently with a second indicator corresponding to the second symbol decoder.

Example 8

An integrated circuit to decompress data, comprising: first symbol decoder of a plurality of symbol decoders to be operated concurrently with each other, the first symbol decoder to receive, from a data supplier, a first window of data from a block of compressed data, the first window of data to correspond to a beginning of a first valid symbol, the first symbol decoder to fully decode the first valid symbol and to determine a length of the first valid symbol; a second symbol decoder of the plurality of symbol decoders, the second symbol decoder to receive, from the data supplier, a second window of data from the block of compressed data, the second window of data to correspond to a beginning of a second valid symbol, the second symbol decoder to fully decode the second valid symbol and to determine a length of the second valid symbol; a third symbol decoder of the plurality of symbol decoders, the third symbol decoder to receive, from the data supplier, a third window of data from the block of compressed data, the third window of data corresponding to a beginning of an apparently valid symbol, the third symbol decoder to fully decode the apparently valid symbol and to determine a length of the apparently valid symbol, the third window of data to comprise data that is located between the first window of data and the second window of data in the block of compressed data; and, a symbol selector to, based on the length of the first symbol, select the second symbol as a valid symbol.

Example 9

The integrated circuit of example 8, wherein, based on the length of the first symbol, the symbol selector does not select the apparently valid symbol.

Example 10

The integrated circuit of example 9, wherein the first symbol decoder is to receive, from the data supplier, a fourth window of data from the block of compressed data, the fourth window of data to correspond to a beginning of a third valid symbol, the first symbol decoder to fully decode the third valid symbol and to determine a length of the third valid symbol.

Example 11

The integrated circuit of example 10, wherein the third valid symbol is determined to be valid based on the length of the first valid symbol and the length of the second valid symbol.

Example 12

The integrated circuit of example 11, wherein a first location in the block of compressed data where the first variable length valid symbol begins is to be calculated concurrently with a second location in the block of compressed data where the second variable length valid symbol begins and a third location in the block of compressed data where the third variable length valid symbol begins.

Example 13

The integrated circuit of example 11, wherein a first indicator corresponding to the first symbol decoder is to be calculated concurrently with a second indicator corresponding to the second symbol decoder and a third indicator corresponding to the third symbol decoder.

Example 14

The integrated circuit of example 15, wherein a first location in the block of compressed data where the first variable length valid symbol begins, a second location in the block of compressed data where the second variable length valid symbol begins, a third location in the block of compressed data where the third variable length valid symbol begins, a first indicator corresponding to the first symbol decoder, a second indicator corresponding to the second symbol decoder, and a third indicator corresponding to the third symbol decoder are to be calculated concurrently.

Example 15

A method of decompressing data, comprising: providing a plurality of symbol decoders with a first sub-block of data from a block of compressed data, each symbol decoder being provided with a distinct window of contiguous data from the first sub-block of data, the plurality of symbol decoders including a first symbol decoder that receives a first window of contiguous data, a beginning of the first window corresponding to a beginning of a first variable length valid symbol, the plurality of symbol decoders including a second symbol decoder that receives a second window of contiguous data, a beginning of the second window corresponding to a beginning of a second variable length valid symbol in the sub-block of data; decoding, in parallel, by each of the plurality of symbol decoders, a respective variable length symbol and determining a respective bit length of the respective variable length symbol from the respective window of data that was provided to the respective symbol decoders, the first symbol decoder decoding the first variable length valid symbol, the second symbol decoder decoding the second variable length valid symbol; based on the bit length of the first variable length valid symbol, determining the second variable length symbol decoded by the second symbol decoder is a valid symbol; and, based on the bit length of the first variable length valid symbol and the bit length of the second variable length valid symbol, selecting a third symbol decoder that is to be provided with a third window of data from a second sub-block of data from the block of compressed data, a beginning of the third window of data corresponding to a beginning of a third variable length valid symbol.

Example 16

The method of example 15, further comprising: providing the plurality of symbol decoders with the second sub-block of data from the block of compressed data, each symbol decoder being provided with a second respective window of contiguous data from the second sub-block of data.

Example 17

The method of example 16, further comprising: decoding, by the third symbol decoder, the third variable length symbol from the second respective window of data that was provided to the third symbol decoder; and, determining a respective bit length of the third variable length valid symbol.

Example 18

The method of example 17, further comprising: selecting, based on an indicator of an output data width, the respective bit length of the first variable length valid symbol, the respective bit length of the second variable length valid symbol, and a respective bit length of the third variable length valid symbol, a set of decoded symbols to output.

Example 19

The method of example 18, further comprising: calculating, concurrently, a first location in the block of compressed data where the first variable length valid symbol begins concurrently, a second location in the block of compressed data where the second variable length valid symbol begins, and a third location in the block of compressed data where the third variable length valid symbol begins.

Example 20

The method of example 18, further comprising: calculating, concurrently, a first indicator corresponding to the first symbol decoder, a second indicator corresponding to the second symbol decoder, and a third indicator corresponding to the third symbol decoder.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. A data decompressor, comprising:
a compressed data supplier to provide a first set of distinct windows of contiguous data from a block of compressed data to each of a plurality of symbol decoders;
the plurality of symbol decoders to each attempt, concurrently, to fully decode a respective variable length symbol that begins at a respective starting location of the window of contiguous data provided to the respective symbol decoder;
the plurality of symbol decoders to include a first symbol decoder that is to receive a first window of data from the first set of distinct windows having a beginning that corresponds to a beginning of a first variable length valid symbol, the first symbol decoder to fully decode the first variable length valid symbol and to determine a first length of the first variable length valid symbol; and,
the plurality of symbol decoders to include a second symbol decoder that is to receive a second window of data having a beginning that corresponds to a beginning of a second variable length valid symbol, the output of the second symbol decoder to be selected as an output of the data decompressor based on the first length.

2. The data decompressor of claim 1, wherein the second variable length valid symbol is in the first set of distinct windows.

3. The data decompressor of claim 1, wherein the second variable length valid symbol is in a second set of distinct windows.

4. The data decompressor of claim 3, wherein the second symbol decoder is to fully decode a second variable length valid symbol and is to determine a second length of the second variable length valid symbol.

5. The data decompressor of claim 4, wherein the second set of distinct windows is to, based on the first length, be determined to include the second variable length valid symbol.

6. The data decompressor of claim 1, wherein a first location in the block of compressed data where the first variable length valid symbol begins is to be calculated concurrently with a second location in the block of compressed data where the second variable length valid symbol begins.

7. The data decompressor of claim 1, wherein a first indicator corresponding to the first symbol decoder is to be calculated concurrently with a second indicator corresponding to the second symbol decoder.

8. An integrated circuit to decompress data, comprising:
a first symbol decoder of a plurality of symbol decoders to be operated concurrently with each other, the first symbol decoder to receive, from a data supplier, a first window of data from a block of compressed data, the first window of data to correspond to a beginning of a first valid symbol, the first symbol decoder to fully decode the first valid symbol and to determine a length of the first valid symbol;
a second symbol decoder of the plurality of symbol decoders, the second symbol decoder to receive, from the data supplier, a second window of data from the block of compressed data, the second window of data to correspond to a beginning of a second valid symbol, the second symbol decoder to fully decode the second valid symbol and to determine a length of the second valid symbol;
a third symbol decoder of the plurality of symbol decoders, the third symbol decoder to receive, from the data supplier, a third window of data from the block of compressed data, the third window of data corresponding to a beginning of an apparently valid symbol, the third symbol decoder to fully decode the apparently valid symbol and to determine a length of the apparently valid symbol, the third window of data to comprise data that is located between the first window of data and the second window of data in the block of compressed data; and, a symbol selector to, based on the length of the first symbol, select the second symbol as a valid symbol.

9. The integrated circuit of claim 8, wherein, based on the length of the first symbol, the symbol selector does not select the apparently valid symbol.

10. The integrated circuit of claim 9, wherein the first symbol decoder is to receive, from the data supplier, a fourth window of data from the block of compressed data, the fourth window of data to correspond to a beginning of a third valid symbol, the first symbol decoder to fully decode the third valid symbol and to determine a length of the third valid symbol.

11. The integrated circuit of claim 10, wherein the third valid symbol is determined to be valid based on the length of the first valid symbol and the length of the second valid symbol.

12. The integrated circuit of claim 11, wherein a first location in the block of compressed data where the first variable length valid symbol begins is to be calculated concurrently with a second location in the block of compressed data where the second variable length valid symbol begins and a third location in the block of compressed data where the third variable length valid symbol begins.

13. The integrated circuit of claim 11, wherein a first indicator corresponding to the first symbol decoder is to be calculated concurrently with a second indicator corresponding to the second symbol decoder and a third indicator corresponding to the third symbol decoder.

14. A method of decompressing data, comprising:
providing a plurality of symbol decoders with a first sub-block of data from a block of compressed data, each symbol decoder being provided with a distinct window of contiguous data from the first sub-block of data, the plurality of symbol decoders including a first symbol decoder that receives a first window of contiguous data, a beginning of the first window corresponding to a beginning of a first variable length valid symbol, the plurality of symbol decoders including a second symbol decoder that receives a second window of contiguous data, a beginning of the second window corresponding to a beginning of a second variable length valid symbol in the sub-block of data;
decoding, in parallel, by each of the plurality of symbol decoders, a respective variable length symbol and determining a respective bit length of the respective variable length symbol from the respective window of data that was provided to the respective symbol decoders, the first symbol decoder decoding the first variable length valid symbol, the second symbol decoder decoding the second variable length valid symbol;

based on the bit length of the first variable length valid symbol, determining whether the second variable length symbol decoded by the second symbol decoder is a valid symbol; and, based on the bit length of the first variable length valid symbol and the bit length of the second variable length valid symbol, selecting a third symbol decoder that is to be provided with a third window of data from a second sub-block of data from the block of compressed data, a beginning of the third window of data corresponding to a beginning of a third variable length valid symbol.

15. The integrated circuit of claim 14, wherein a first location in the block of compressed data where the first variable length valid symbol begins, a second location in the block of compressed data where the second variable length valid symbol begins, a third location in the block of compressed data where the third variable length valid symbol begins, a first indicator corresponding to the first symbol decoder, a second indicator corresponding to the second symbol decoder, and a third indicator corresponding to the third symbol decoder are to be calculated concurrently.

16. The method of claim 14, further comprising:
providing the plurality of symbol decoders with the second sub-block of data from the block of compressed data, each symbol decoder being provided with a second respective window of contiguous data from the second sub-block of data.

17. The method of claim 16, further comprising:
decoding, by the third symbol decoder, the third variable length symbol from the second respective window of data that was provided to the third symbol decoder; and,
determining a respective bit length of the third variable length valid symbol.

18. The method of claim 17, further comprising:
selecting, based on an indicator of an output data width, the respective bit length of the first variable length valid symbol, the respective bit length of the second variable length valid symbol, and a respective bit length of the third variable length valid symbol, a set of decoded symbols to output.

19. The method of claim 18, further comprising:
calculating, concurrently, a first location in the block of compressed data where the first variable length valid symbol begins concurrently, a second location in the block of compressed data where the second variable length valid symbol begins, and a third location in the block of compressed data where the third variable length valid symbol begins.

20. The method of claim 18, further comprising:
calculating, concurrently, a first indicator corresponding to the first symbol decoder, a second indicator corresponding to the second symbol decoder, and a third indicator corresponding to the third symbol decoder.

* * * * *